United States Patent
Yoshizawa

(10) Patent No.: US 7,014,415 B2
(45) Date of Patent: Mar. 21, 2006

(54) SUBSTRATE TRANSFER APPARATUS, METHOD FOR REMOVING THE SUBSTRATE, AND METHOD FOR ACCOMMODATING THE SUBSTRATE

(75) Inventor: Takenori Yoshizawa, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 8 days.

(21) Appl. No.: 10/722,437

(22) Filed: Nov. 28, 2003

(65) Prior Publication Data

US 2004/0104139 A1 Jun. 3, 2004

(30) Foreign Application Priority Data

Nov. 29, 2002 (JP) .............................. 2002-348903

(51) Int. Cl.
*B65G 49/06* (2006.01)
(52) U.S. Cl. .................. 414/797.5; 414/937; 414/422; 414/795.7
(58) Field of Classification Search ............. 414/937, 414/938, 287, 288, 935, 796.5, 797.4, 797.9, 414/797.5, 331.01, 331.03, 331.04, 331.14, 414/331.18, 592, 609, 416, 795.7; 118/720, 118/729
See application file for complete search history.

(56) References Cited

U.S. PATENT DOCUMENTS

| | | | | |
|---|---|---|---|---|
| 3,945,505 | A * | 3/1976 | Frisbie et al. ........... | 414/331.14 |
| 5,275,521 | A * | 1/1994 | Wada ........................ | 414/404 |
| 5,334,257 | A * | 8/1994 | Nishi et al. ................. | 118/500 |
| 5,380,137 | A * | 1/1995 | Wada ........................ | 414/172 |
| 5,626,456 | A * | 5/1997 | Nishi ........................ | 414/404 |
| 6,231,716 | B1 * | 5/2001 | White et al. ........... | 156/345.54 |
| 6,524,051 | B1 * | 2/2003 | Nering ................... | 414/331.01 |
| 6,530,994 | B1 * | 3/2003 | Mahawili ..................... | 118/725 |
| 6,717,171 | B1 * | 4/2004 | Harris et al. ............. | 250/559.4 |
| 6,759,336 | B1 * | 7/2004 | Chebi et al. ................ | 438/694 |
| 6,782,544 | B1 * | 8/2004 | Russ .......................... | 720/619 |
| 6,854,948 | B1 * | 2/2005 | Spady et al. ........... | 414/416.03 |
| 6,875,466 | B1 * | 4/2005 | Matsui et al. ............... | 427/240 |
| 6,878,955 | B1 * | 4/2005 | Harris et al. ........... | 250/559.33 |
| 6,935,466 | B1 * | 8/2005 | Lubomirsky et al. ....... | 187/250 |

FOREIGN PATENT DOCUMENTS

| | | |
|---|---|---|
| JP | 10-287382 A | 10/1998 |
| JP | 2001-93969 A | 4/2001 |
| KP | 2001-0081967 A | 8/2001 |

* cited by examiner

*Primary Examiner*—Douglas Hess
(74) *Attorney, Agent, or Firm*—Birch, Stewart, Kolasch & Birch, LLP

(57) ABSTRACT

A substrate transfer apparatus, for removing a substrate from a substrate accommodating tray accommodating the substrate in a horizontal state, includes a plurality of support pins for raising the substrate accommodated in the substrate accommodating tray above the substrate accommodating tray. The substrate accommodating tray includes a plurality of openings through which the plurality of support pins are to be inserted. The plurality of support pins are moved up relative to the substrate accommodating tray and are inserted through the plurality of openings of the substrate accommodating tray, so as to raise the substrate. The plurality of support pins each have a length sufficient to be vertically inserted through a plurality of substrate accommodating trays stacked vertically.

20 Claims, 15 Drawing Sheets

SUBSTRATE TRANSFER APPARATUS, METHOD FOR REMOVING THE SUBSTRATE, AND METHOD FOR ACCOMMODATING THE SUBSTRATE

CROSS REFERENCE TO RELATED APPLICATION

This application is based on Patent Application No. 2002-348903 filed in Japan on Nov. 29, 2002, the contents of which are incorporated hereinto by reference.

BACKGROUND OF THE INVENTION

1. Field of the Invention

The present invention relates to a substrate transfer apparatus for removing a substrate from, or accommodating or placing a substrate in a substrate accommodating tray, a method for removing the substrate from the substrate accommodating tray using the substrate transfer apparatus, and a method for accommodating the substrate in the substrate accommodating tray using the substrate transfer apparatus. The substrate is used for producing a display panel of, for example, a liquid crystal display device.

2. Description of the Related Art

A display panel for a liquid crystal display device usually includes a pair of display glass substrates opposed to each other and sealed together, and a liquid crystal material sealed between the pair of glass substrates. In order to produce such a display panel, glass substrates are transported to a display panel production plant. For transporting the glass substrates, a glass substrate accommodating box for accommodating a plurality of glass substrates is usually used. Glass substrates are used in display panels of various types of display devices as well as liquid crystal display devices. The above-mentioned type of glass substrate accommodating box is also used for transporting glass substrates used for the various types of display devices other than liquid crystal display devices.

The same type of glass substrate accommodating box is used for transporting glass substrates having electrodes and the like formed thereon as half-finished products, which will be used for producing display panels.

Recently, glass substrates having a thickness of 0.7 mm or less are widely used for various types of display panels. As the glass substrates are increasing in size, the planar area of the glass substrates which are carried to the display panel production plants is increasing, and even glass substrates having a side length of 1.3 m or greater are used.

Such a large and thin glass substrate easily warps. When a plurality of such glass substrates are vertically accommodated in the box with an interval, the glass substrates may warp and contact each other and break during transportation. In order to avoid this, it is necessary to keep an appropriate distance between the glass substrates in the box.

For example, a glass substrate having a thickness of 0.7 mm and a side length of 1.3 m or greater, when supported along the periphery thereof with a support having a width of 20 to 30 mm in a vertical state may warp by 90 mm or greater at the center thereof. In a glass substrate accommodating box, it is necessary to keep a distance of 100 mm or greater between the glass substrates in the box. This inevitably increases the size of the glass accommodating box.

A glass substrate is removed from a glass substrate accommodating box using, for example, a glass substrate adsorption hand as disclosed in Japanese Laid-Open Publication No. 2001-93969. The glass substrate adsorption hand has a pair of flat adsorption pads. Each adsorption pad needs to be inserted between two adjacent glass substrates, which requires a space for inserting the adsorption pad. A flat adsorption pad usually has a thickness of about 20 mm. Therefore, the distance between the glass substrates in the box needs to be the sum of a distance sufficient for preventing the glass substrates from contacting each other even when the glass substrates warp and a distance of about 20 mm for inserting the adsorption pad. This also inevitably increases the size of the glass accommodating box.

Due to the necessary space between two adjacent glass substrates, the number of glass substrates which can be accommodated in a glass substrate accommodating box having a prescribed size is limited. This lowers the space efficiency for transportation and storage, i.e., the number of glass substrates which can be accommodated per unit volume.

In order to solve these problems, Japanese Laid-Open Publication No. 10-287382 discloses a substrate tray cassette for accommodating one glass substrate. A substrate accommodating section of the substrate tray cassette has a lattice structure. The substrate tray cassette is structured such that a plurality of substrate tray cassettes can be stacked vertically. Such a substrate tray cassette allows a large and thin glass substrate to be accommodated without warping and thus without being broken during transportation. Since a greater number of substrate tray cassettes can be stacked vertically for transportation and storage, the space efficiency can be improved.

However, this substrate tray cassette has the following problems. The accommodated glass substrate is supported by resin pins, and a pair of adsorption pads of a glass substrate adsorption hand are put into the space below the glass substrate which is supported by the resin pins. Such a space for the adsorption pads increases the size of the substrate tray cassette.

In order to remove the glass substrate accommodated in the substrate tray cassette using an adsorption hand, it is necessary to separate the plurality of substrate tray cassettes stacked vertically one by one so as to make a large space above the accommodated glass substrate. Accordingly, in order to automatically remove the glass substrate from each of the substrate tray cassettes stacked vertically, a large and complicated apparatus is required.

In order to remove the glass substrate from each of the plurality of substrate tray cassettes stacked vertically and then stack the substrate tray cassettes vertically after the glass substrates are removed from the substrate tray cassettes, a large work space is required and it is impossible to work efficiently.

SUMMARY OF THE INVENTION

According to one aspect of the invention, a substrate transfer apparatus for removing a substrate from a substrate accommodating tray accommodating the substrate in a horizontal state is provided. The substrate transfer apparatus includes a plurality of support pins for raising the substrate accommodated in the substrate accommodating tray above the substrate accommodating tray. The substrate accommodating tray includes a plurality of openings through which the plurality of support pins are to be inserted. The plurality of support pins are moved up relative to the substrate accommodating tray and are inserted through the plurality of openings of the substrate accommodating tray, so as to raise the substrate. The plurality of support pins each have a length sufficient to be vertically inserted through a plurality of substrate accommodating trays stacked vertically.

In one embodiment of the invention, the substrate transfer apparatus further includes an elevatable table for raising and lowering the substrate accommodating tray while having the substrate accommodating tray on the elevatable table. The plurality of support pins are inserted through the plurality of openings of the plurality of substrate accommodating trays stacked vertically on the elevatable table as the elevatable table moves down.

In one embodiment of the invention, the elevatable table is moved up and down by a ball screw mechanism.

In one embodiment of the invention, the elevatable table is moved up and down by a belt transport mechanism.

According to another aspect of the invention, a substrate transfer apparatus for removing a substrate from a substrate accommodating tray accommodating the substrate in a horizontal state is provided. The substrate transfer apparatus includes a tray holding unit for holding, in a horizontal state, at least one of a plurality of substrate accommodating trays stacked vertically; and a plurality of support pins for raising a substrate accommodated in a prescribed substrate accommodating tray which is released from the tray holding unit above the prescribed substrate accommodating tray. The plurality of substrate accommodating trays each include a plurality of openings through which the plurality of support pins are to be inserted. The plurality of support pins are moved up relative to the prescribed substrate accommodating tray and are inserted through the plurality of openings of the prescribed substrate accommodating tray, so as to raise the substrate accommodated in the prescribed substrate accommodating tray.

In one embodiment of the invention, the plurality of support pins are inserted into the plurality of openings of a plurality of substrate accommodating trays released from the tray holding unit, so as to raise the substrate accommodated in the prescribed substrate accommodating tray.

In one embodiment of the invention, the substrate transfer apparatus further includes an elevatable table for raising and lowering at least one substrate accommodating tray released from the tray holding unit while having the at least one substrate accommodating tray on the elevatable table. Where a plurality of substrate accommodating trays stacked vertically are placed on the elevatable table, the plurality of support pins are inserted through the plurality of openings of the plurality of substrate accommodating trays placed on the elevatable table as the elevatable table moves down, so as to raise the substrate accommodated in the prescribed substrate accommodating tray.

In one embodiment of the invention, the tray holding unit holds each of the plurality of substrate accommodating trays in a horizontal state.

In one embodiment of the invention, the tray holding unit holds at least one of the plurality of substrate accommodating tray in a horizontal state, the at least one substrate accommodating tray accommodating a substrate.

In one embodiment of the invention, the tray holding unit includes an engaging claw to be engaged with the at least one substrate accommodating tray.

In one embodiment of the invention, the tray holding unit holds the at least one substrate accommodating tray by a frictional force.

In one embodiment of the invention, the elevatable table is moved up and down by a ball screw mechanism.

In one embodiment of the invention, the elevatable table is moved up and down by a belt transport mechanism.

According to still another aspect of the invention, a method for removing a substrate accommodated in each of a plurality of substrate accommodating trays stacked vertically is provided. The method includes the steps of (a) separating the lowest substrate accommodating tray, among a plurality of substrate accommodating trays each accommodating a substrate, from the second lowest substrate accommodating trays, among the plurality of substrate accommodating trays each accommodating a substrate, and lowering the lowest substrate accommodating tray; and (b) inserting a plurality of support pins into a plurality of openings formed in the lowered substrate accommodating tray, thereby raising a substrate accommodated in the lowered substrate accommodating tray by the plurality of support pins.

In one embodiment of the invention, the method further includes the step of (c) transferring the substrate raised by the plurality of support pins. The steps (a) through (c) are repeated.

According to still another aspect of the invention, a method for removing a substrate accommodated in each of a plurality of substrate accommodating trays stacked vertically is provided. The method includes the steps of (a) placing the plurality of substrate accommodating trays each accommodating a substrate on an elevatable table; (b) holding, by a tray holding unit, at least one of a plurality of substrate accommodating trays each accommodating a substrate other than the lowest substrate accommodating tray among the plurality of substrate accommodating trays each accommodating a substrate; (c) lowering the elevatable table and inserting a plurality of support pins into a plurality of openings formed in the substrate accommodating tray placed on the elevatable table, thereby raising a substrate accommodated in the substrate accommodating tray placed on the elevatable table by the plurality of support pins; (d) transferring the substrate raised by the plurality of support pins.

In one embodiment of the invention, the method further includes the steps of (e) after step (d), raising the elevatable table and contacting the substrate accommodating tray placed on the elevatable table with the lowest substrate accommodating tray among the at least one substrate accommodating tray held by the tray holding unit; (f) releasing the at least one substrate accommodating tray from the tray holding unit and placing the released substrate accommodating tray on the elevatable table; and (g) after step (f), performing steps (b) through (d) once more.

In one embodiment of the invention, steps (e) through (g) are repeated.

According to still another aspect of the invention, a method for accommodating a substrate in each of a plurality of substrate accommodating trays stacked vertically is provided. The method includes the steps of (a) placing at least one substrate accommodating tray accommodating no substrate on an elevatable table and inserting a plurality of support pins into a plurality of openings formed in the at least one substrate accommodating tray; (b) placing a substrate on the plurality of support pins in a horizontal state; (c) raising the elevatable table and accommodating the substrate supported by the support pins in the highest substrate accommodating tray among the at least one substrate accommodating tray; and (d) holding the substrate accommodating tray, accommodating the substrate, by a tray holding unit.

In one embodiment of the invention, the method further includes the step of (e) after step (d), lowering the elevatable table and inserting the plurality of support pins into a plurality of openings formed in at least one substrate accommodating tray accommodating no substrate. Steps (b) through (e) are repeated.

Thus, the invention described herein makes possible the advantages of providing a substrate transfer apparatus for removing a substrate, such as a glass substrate for display or the like, from each of a plurality of substrate accommodating trays stacked vertically and accommodating such a substrate in each of the plurality of substrate accommodating trays stacked vertically with high efficiency; a method for removing the substrate using the substrate transfer apparatus, and a method for accommodating the substrate using the substrate transfer apparatus.

These and other advantages of the present invention will become apparent to those skilled in the art upon reading and understanding the following detailed description with reference to the accompanying figures.

DESCRIPTION OF THE INVENTION

Hereinafter, the present invention will be described by way of illustrative examples with reference to the accompanying drawings.

Figure 1:
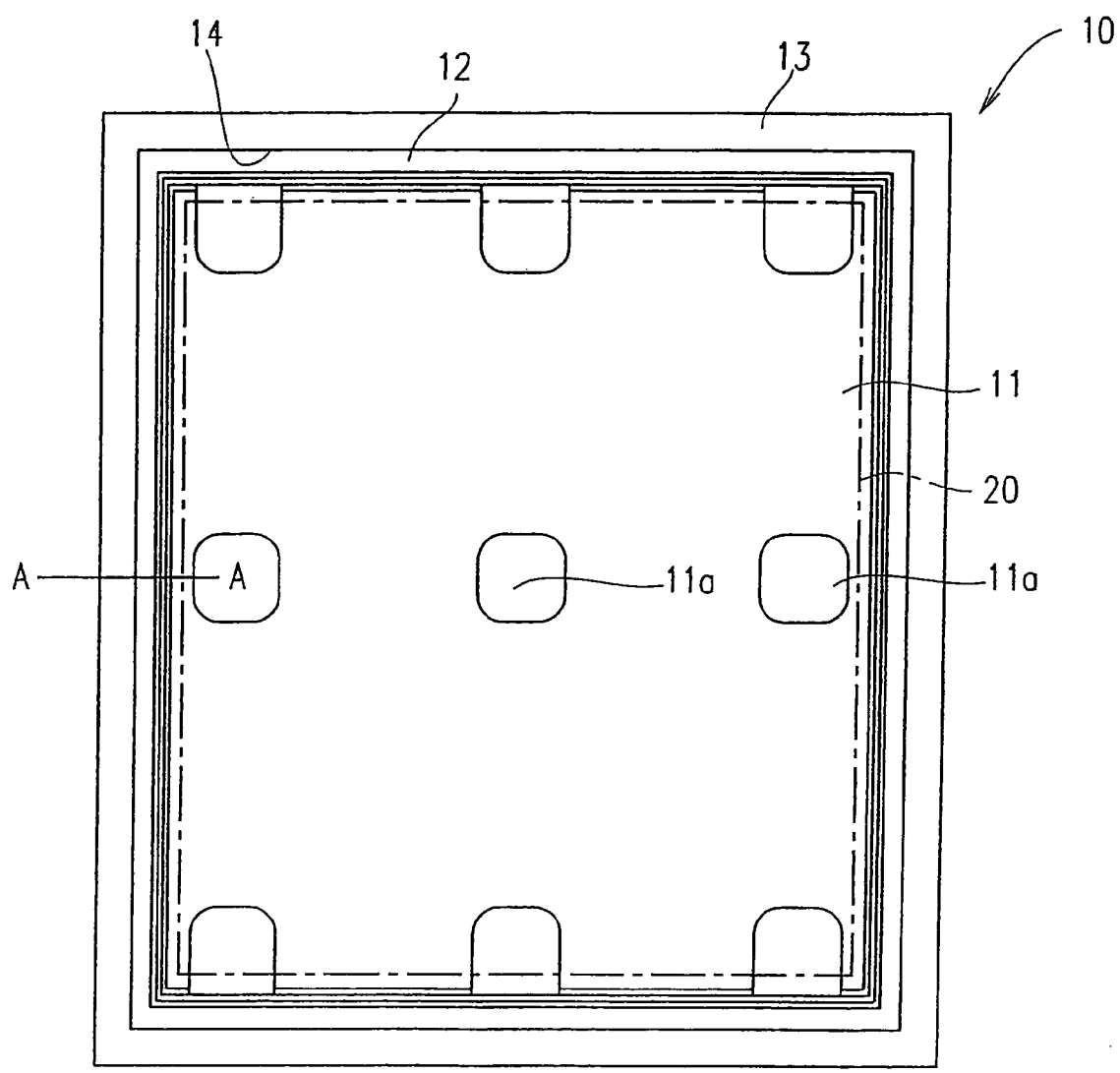
FIG. 1 is a plan view of an exemplary substrate accommodating tray used for the present invention.
Figure 2:
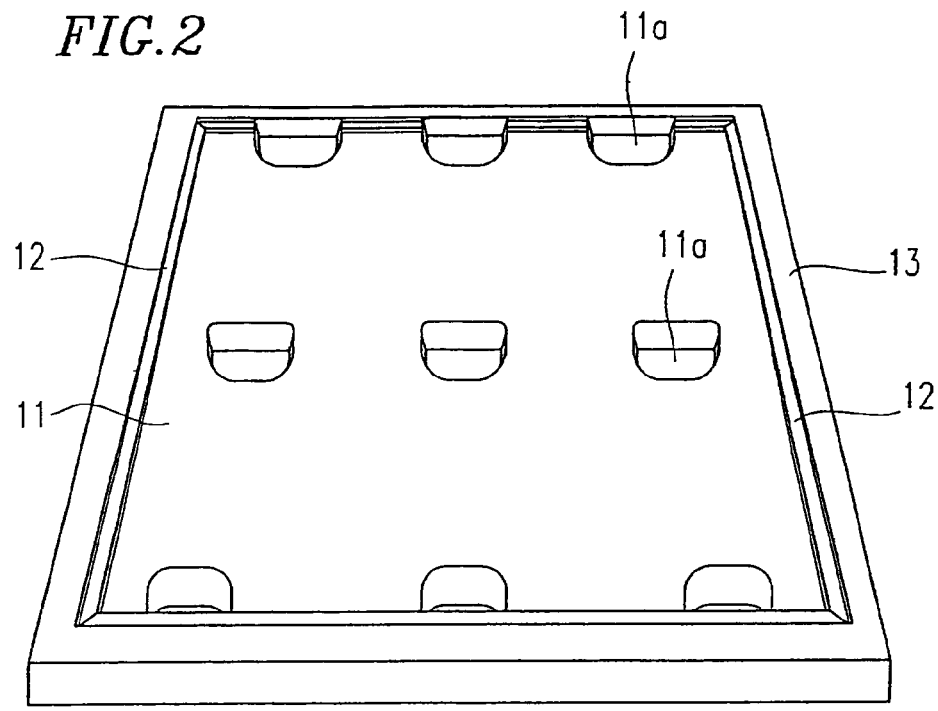
FIG. 2 is an isometric view of the substrate accommodating tray shown in FIG. 1.
Figure 3:
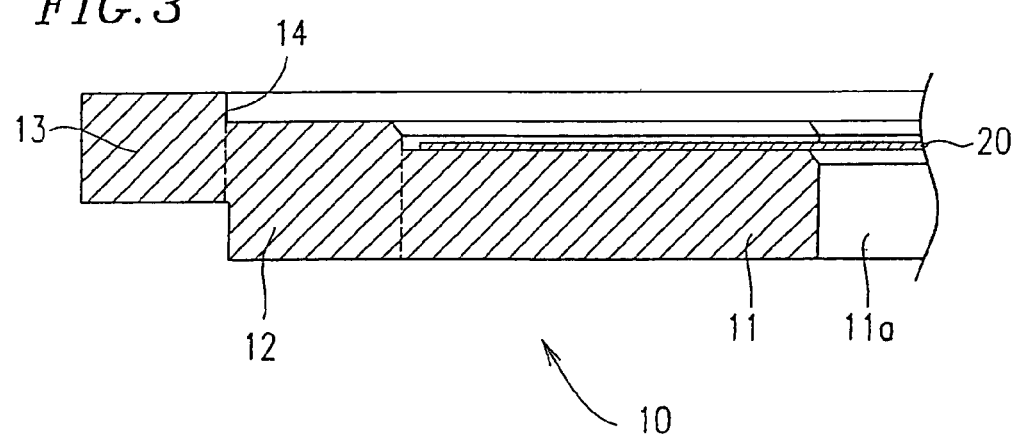
FIG. 3 is a partial cross-sectional view of the substrate accommodating tray shown in FIG. 1.

FIG. 1 is a plan view illustrating a substrate accommodating tray 10 used for the present invention. FIG. 2 is a perspective view of the substrate accommodating tray 10, and FIG. 3 is a partial cross-sectional view of the substrate accommodating tray 10 taken along line A—A in FIG. 1. The substrate accommodating tray 10 is useful for accommodating a glass substrate used for, for example, a liquid crystal display panel; specifically, a glass substrate having a side length of 1.3 m or greater and a thickness of 0.7 mm or less, for transportation or storage. A substrate transfer apparatus 30 (FIG. 5) according to the present invention is used for, for example, removing the glass substrate 20 from the substrate accommodating tray 10.

The substrate accommodating tray 10 is molded to be a thin rectangular parallelepiped. The substrate accommodating tray 10 includes a rectangular bottom section 11 for mounting thereon a glass substrate 20 as a display substrate in a substantially horizontal fashion, and a frame 12 for surrounding the entire periphery of the glass substrate 20 when the glass substrate 20 is mounted on the bottom section 11. The frame 12 is provided along the entire periphery of the bottom section 11, and projects to a level higher than the level of a top surface of the bottom section 11. The bottom section 11 and the frame 12 are integrally molded from a foam polyethylene resin or the like, which is a synthetic resin foam material, or the like. The frame 12 may be provided along the periphery of the bottom section 11 such that the frame 12 surrounds at least a part of the glass substrate 20.

The bottom section 11 has a rectangular shape which is slightly larger than the glass substrate 20, and has a thickness of, for example, about 15 mm. The glass substrate 20 is mounted on the top surface of the bottom section 11.

Square openings 11a are formed in the vicinity of the corners of the bottom section 11 and at intermediate positions between the corners along the four sides of the bottom section 11. A square opening 11a is also formed at the center of the bottom section 11. Thus, the bottom section 11 has nine openings 11a arranged in a 3×3 matrix. Support pins 34 (FIG. 5) can be inserted into the openings 11a as supporting members. The support pins 34 raise the glass substrate 20 from the bottom section 11 for removing the glass substrate 20 from the substrate accommodating tray 10.

The frame 12 is provided along the entire periphery of the bottom section 11 as described above, and has a width of about 30 mm. The frame 12 projects to a level higher than the level of the top surface of the bottom section 11 by about 5 mm or greater. The frame 12 surrounds the entire periphery of the glass substrate 20 mounted on the bottom section 11 at an appropriate distance from the edge of the glass substrate 20.

An engaging section 13 is provided along the entire periphery of the frame 12. More specifically, the engaging section 13 is provided such that a step is formed between a bottom surface of the engaging section 13 and a bottom surface of the frame 12, and projects to a level higher than a top surface of the frame 12. The engaging section 13 has a width of, for example, about 30 mm and horizontally projects outward from the frame 12. The engaging section 13 has a rectangular cross-section, and is engageable with a chuck nail (not shown in FIG. 1) for chucking. The chuck nail acts as a transfer member for transferring the substrate accommodating tray 10 to a prescribed position. The bottom section 11, the frame 12, and the engaging section 13 may be integrally molded from a foam polyethylene resin or the like.

A top surface of the engaging section 13 extends horizontally outside and above the top surface of the frame 12. The frame 12 has a positioning step 14 (positioning portion; FIG. 3), which is provided between the top surface of the engaging section 13 and the top surface of the frame 12. The positioning step 14 is vertical to the top surface of the frame 12. The positioning step 14 is provided along the entire periphery of the frame 12, and acts to determine the positional relationship between the substrate accommodating tray 10 and another substrate accommodating tray 10 which is to be stacked thereon.

In the substrate accommodating tray 10 having the above-described structure, the glass substrate 20 (for example, a glass substrate for a liquid crystal panel having a thickness of 0.7 mm or less) is accommodated on the top surface of the bottom section 11. A surface of the glass substrate 20 which does not have electrodes or the like is in contact with the top surface of the bottom section 11. As described above, the bottom section 11 is slightly larger than the glass substrate 20, and thus the glass substrate 20 is mounted on the bottom section 11 at an appropriate distance from the edge of the frame 12.

Figure 4:
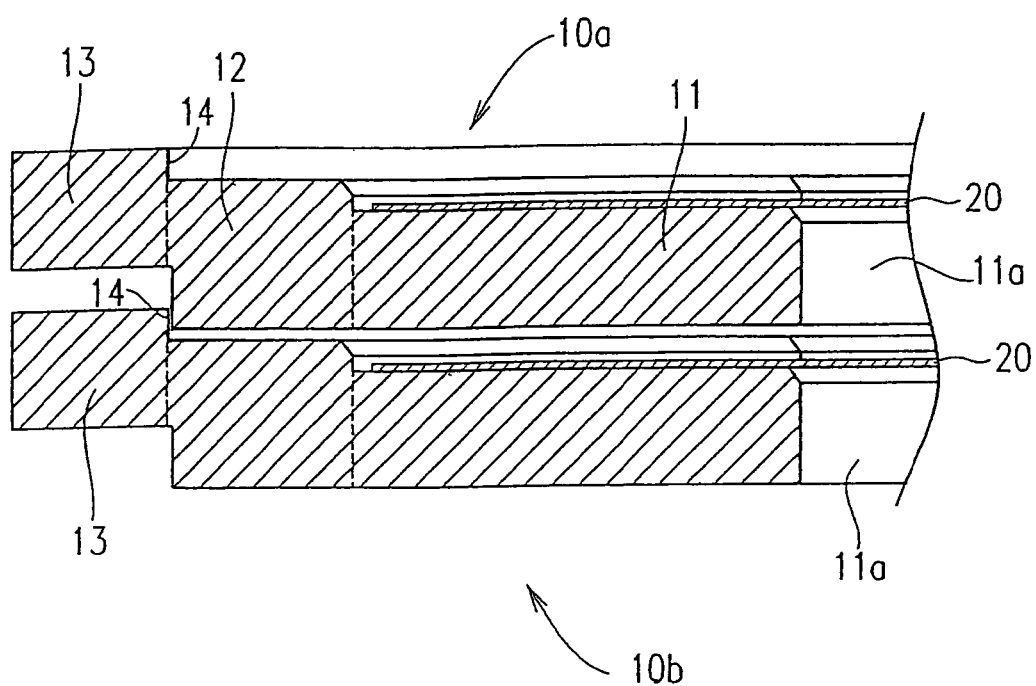
FIG. 4 is a partial cross-sectional view of a plurality of substrate accommodating trays vertically stacked together, each of which is shown in FIG. 3.

As shown in FIG. 4, a plurality of substrate accommodating trays 10 (only two are shown in FIG. 4 for the sake of simplicity) each accommodating a glass substrate 20 can be stacked vertically and transported in this state. A bottom edge of the frame 12 of an upper substrate accommodating tray (indicated by reference numeral 10a for the sake of clarity) is engaged with the positioning step 14 of a lower substrate accommodating tray (indicated by reference numeral 10b for the sake of clarity). Therefore, the substrate accommodating trays 10a and 10b stacked vertically do not slip in a horizontal direction with respect to each other.

For example, a plurality of (for example, about 10) substrate accommodating trays 10 each accommodating a glass substrate 20 can be stacked vertically and transported. Each display substrate accommodating tray 10 is thin, and thus significantly improves the space efficiency. As a result, a great number of glass substrates 20 can be transported and stored with high efficiency.

A bottom surface of the frame 12 of the uppermost substrate accommodating tray 10 is engaged with the positioning step 14 of the substrate accommodating tray 10 below. Therefore, there is an appropriate space between the engaging section 13 of the uppermost substrate accommodating tray 10 and the engaging section 13 of the substrate accommodating tray 10 below.

Figure 5:
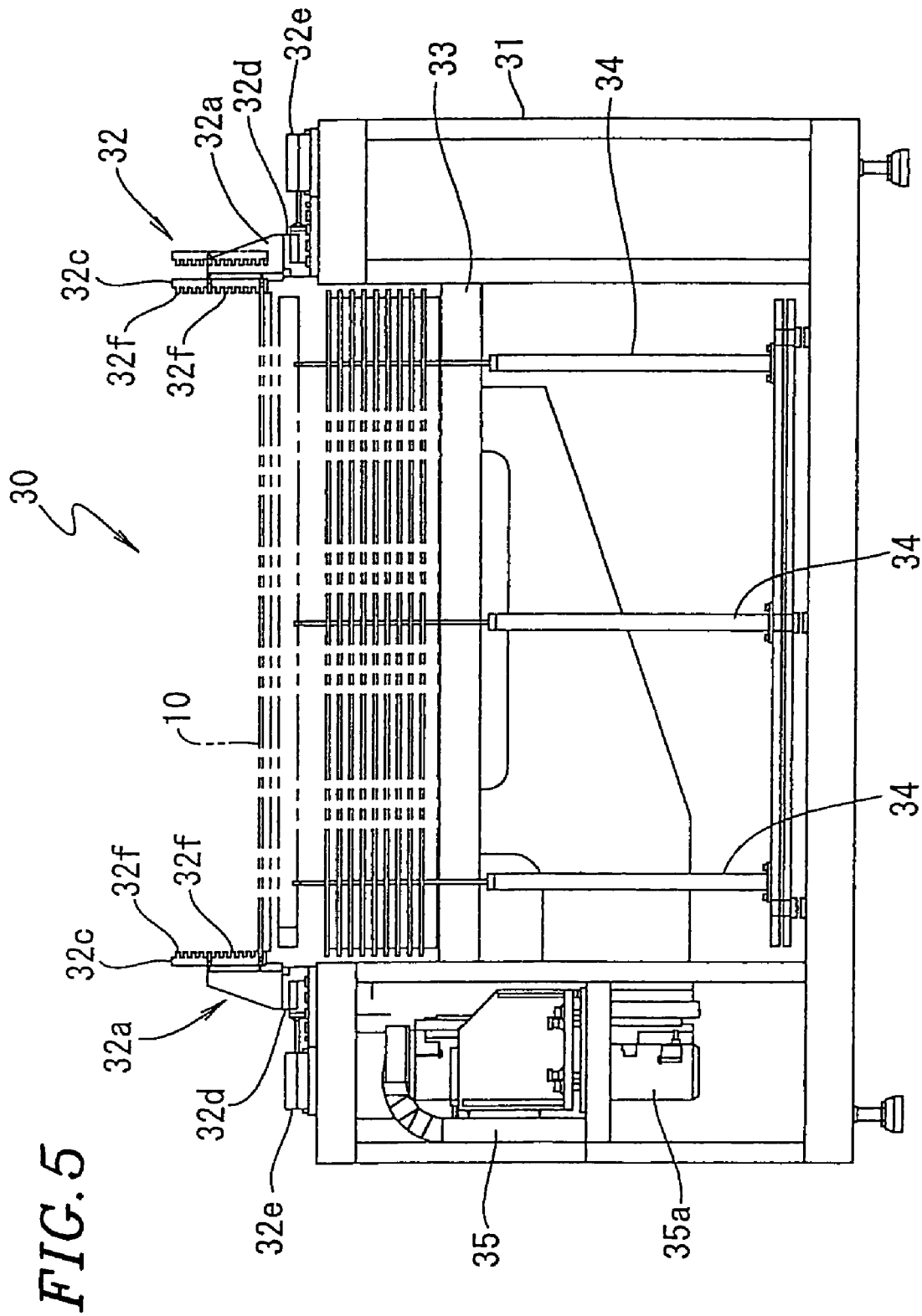
FIG. 5 is a front view of a substrate transfer apparatus according to the present invention.
Figure 6:
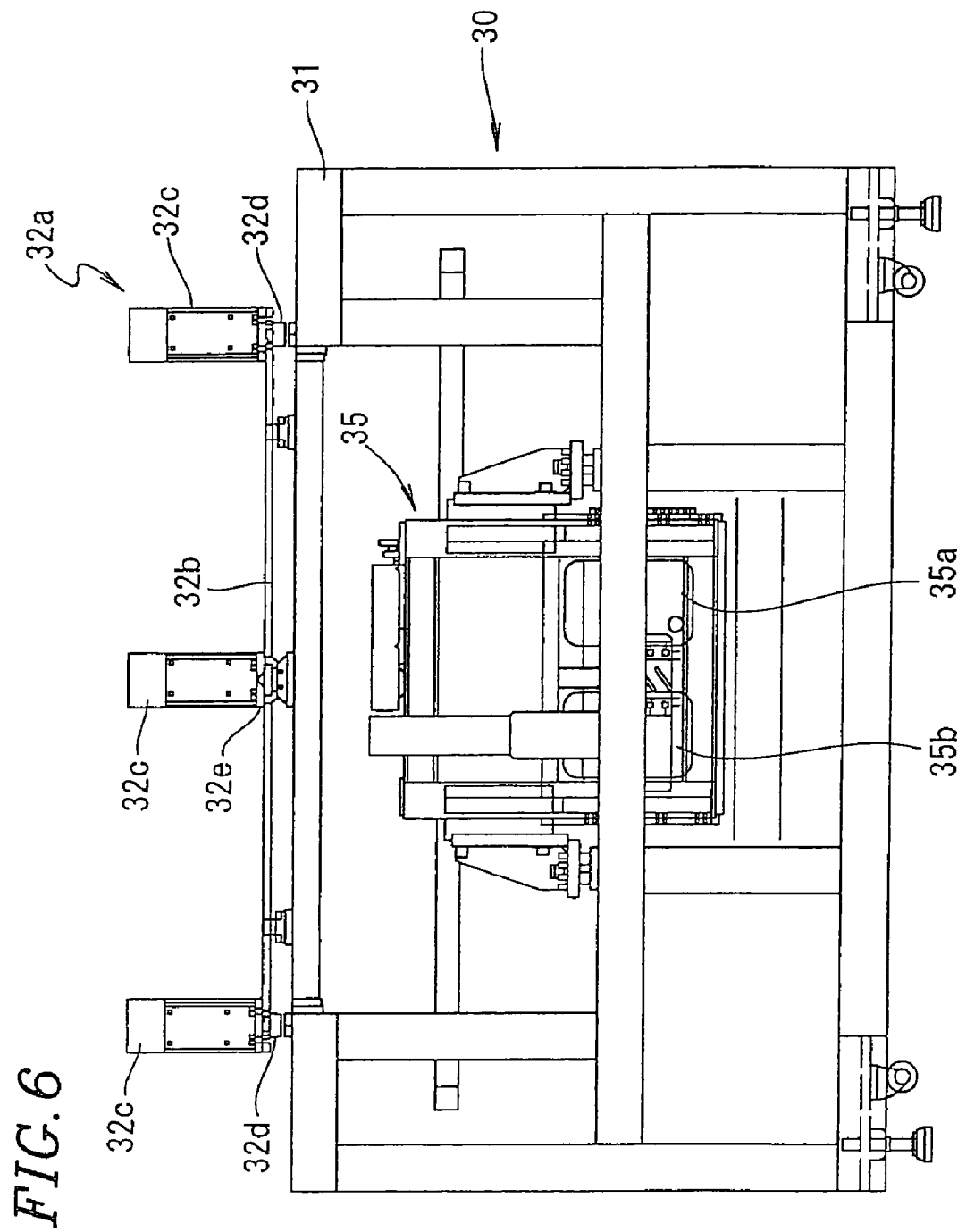
FIG. 6 is a side view of the substrate transfer apparatus shown in FIG. 5.
Figure 7:
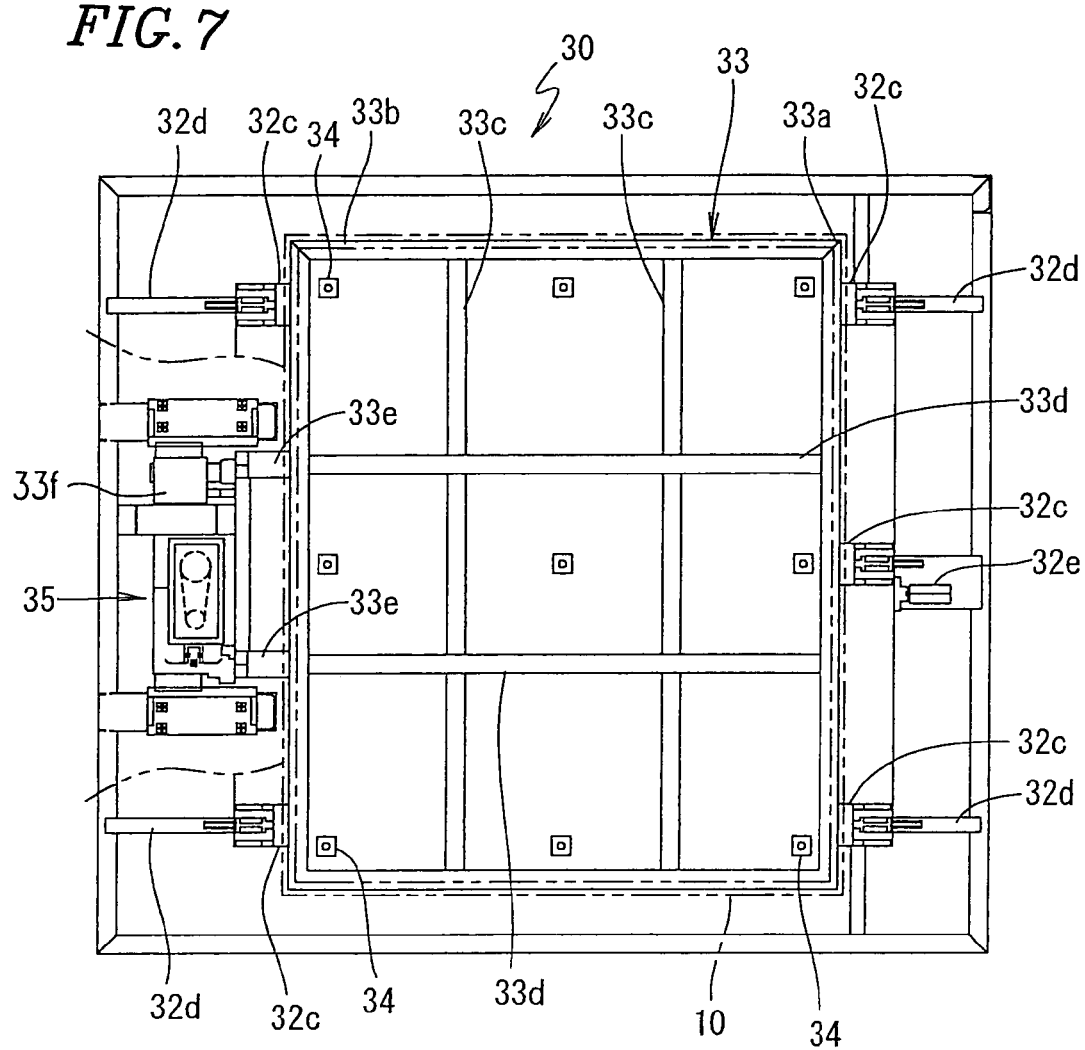
FIG. 7 is a plan view of the substrate transfer apparatus shown in FIG. 5.

The substrate transfer apparatus 30 (FIG. 5) according to the present invention is usable for removing the glass substrate 20 accommodated in the substrate accommodating tray 10 having the above-described structure FIG. 5 is a front view of the substrate transfer apparatus 30 according to an example of the present invention. FIG. 6 is a side view thereof, and FIG. 7 is a plan view thereof.

The substrate transfer apparatus 30 includes a supporting base 31, a tray holding unit 32 provided on the supporting base 31 for holding a plurality of substrate accommodating trays 10 stacked vertically, an elevatable table 33 provided in the supporting base 31 so as to move up and down such that one or a plurality of substrate accommodating trays 10 released from the tray holding unit 32 are placed thereon and move up and down, and a plurality of support pins 34 provided vertically in the supporting base 31 so as to run through the openings 11a of one or a plurality of substrate accommodating trays 10 placed on the elevatable table 33.

The tray holding unit 32 receives the plurality of substrate accommodating trays 10 stacked vertically. The tray holding unit 32 includes a pair of tray side holding sections 32a facing each other. The tray side holding sections 32a are provided for holding opposing sides of the substrate accommodating trays 10.

Each tray side holding section 32a includes a lengthy plate-like support 32b (FIG. 6) provided horizontally along the respective side of the substrate accommodating trays 10, and three tray side engaging members 32c provided on the support 32b at an equal interval. The support 32b is slidable along a pair of slide guides 32d provided on an upper surface of the supporting base 31 such that the support 32b moves closer to or farther from the substrate accommodating trays 10 received by the tray holding unit 32. Such a movement of the support 32b is driven by a hydraulic cylinder 32e provided on the upper surface of the supporting base 31 respectively for each of the tray side engaging members 32c.

The three tray side engaging members 32c provided on one support 32b and the three tray side engaging members 32c provided on the other support 32b respectively face each other. On a surface of each tray side engaging member 32c facing the opposite tray side engaging member 32c, a plurality of engaging claws 32f are provided. The plurality of engaging claws 32f are arranged vertically, and respectively to be engaged with the engaging sections 13 of the plurality of substrate accommodating trays 10 stacked vertically.

The hydraulic cylinders 32e of one tray holding section 32a are driven in synchronization with the hydraulic cylinders 32e of the other tray holding section 32a. Thus, the pair of supports 32b move closer to or farther from the substrate accommodating trays 10 in synchronization with each other. The tray side engaging members 32c, which are provided on the pair of supports 32b, also move closer to or farther from the substrate accommodating trays 10 in synchronization with each other. When the tray side engaging members 32c approach the substrate accommodating trays 10, the engaging claws 32f provided on the tray side engaging members 32c are engaged with the engaging sections 13 of the substrate accommodating trays 10. By this engagement, the substrate accommodating trays 10 are held horizontally. As long as the tray holding section 32a holds the substrate accommodating tray 10 by a frictional force, the tray holding section 32a may have any shape (for example, such a shape as to sandwich the substrate accommodating tray 10 between pair of tray holding sections 32a).

The elevatable table 33 includes a table section 33a (FIG. 7) provided horizontally such that the substrate accommodating trays 10 are placed thereon. The table section 33a includes, for example, a rectangular frame 33b corresponding in shape to the substrate accommodating trays 10, and a pair of bars 33c and a pair of bars 33d arranged in a lattice. The pair of bars 33c extend substantially parallel to the supports 32b, and the pair of bars 33d cross the pair of bars 33c substantially perpendicularly thereto. The bars 33d are supported by a supporting arm 33e at both ends thereof. The supporting arms 33e are connected to an elevating unit 35.

Inside the supporting base 31, a plurality of (nine in this example) support pins 34 are arranged in a 3×3 matrix, in correspondence with the openings 11a of the substrate accommodating trays 10. Each support pin 34 is provided vertically so as to go through the lattice table section 33a. As shown in FIG. 5, a top end of each support pin 34 is slightly below the bottom surface of the lowest substrate accommodating tray 10 held by the tray holding unit 32.

The elevating unit 35 (FIG. 6) is provided for raising and lowering the elevatable table 33. The elevating unit 35 uses an elevating section 33f (FIG. 7) for integrally raising and lowering the plurality of supporting arms 33e of the elevatable table 33. The elevating section 33f includes a ball screw mechanism. Specifically, the elevating unit 35 uses an elevating section 33f for integrally raising and lowering the plurality of supporting arms 33e of the elevatable table 33. The ball screw mechanism is of a usual type; namely, includes a ball screw and a slide block engaged with the ball screw. When the ball screw rotates forward, the elevatable table 33 moves up; and when the ball screw rotates in reverse, the elevatable table 33 moves down. The elevating unit 35 includes a driving motor 35a and a decelerator 35b. The rotation of the driving motor 35a is conveyed to the ball screw mechanism via the decelerator 35b.

With reference to FIGS. 8 through 17, an operation of the substrate transfer apparatus 30 for removing a substrate 20 from each of the substrate accommodating trays 10 will be described.

Figure 8:
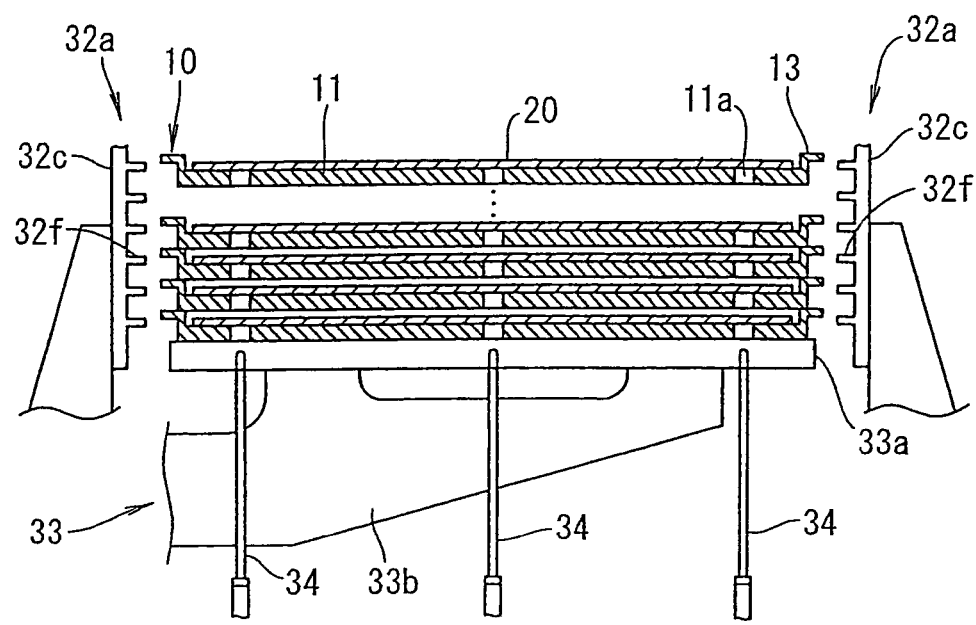
FIGS. 8 through 17 are schematic views illustrating an operation of the substrate transfer apparatus shown in FIG. 5 for removing a substrate from the substrate accommodating tray shown in FIG. 1.

The elevatable table 33 of the substrate transfer apparatus 30 is moved up by the elevating unit 35. Thus, as shown in FIG. 8, the table section 33a of the elevatable table 33 is positioned between lower portions of the pair of tray side holding sections 32a. At this point, the supports 32b are located so as not to be in contact with the substrate accommodating trays 10 even where the substrate accommodating trays 10 are located therebetween. The tray side engaging members 32c on the pair of supports 32b are also located so as not to be in contact with the substrate accommodating trays 10 even where the substrate accommodating trays 10 are located therebetween.

Then, a plurality of substrate accommodating trays 10 stacked vertically, each accommodating a glass substrate 20, are placed on the table section 33a. Thus, the plurality of substrate accommodating trays 10 are located between the three tray side engaging members 32c provided on one support 32b and the three tray side engaging members 32c provided on the other support 32b.

Figure 9:
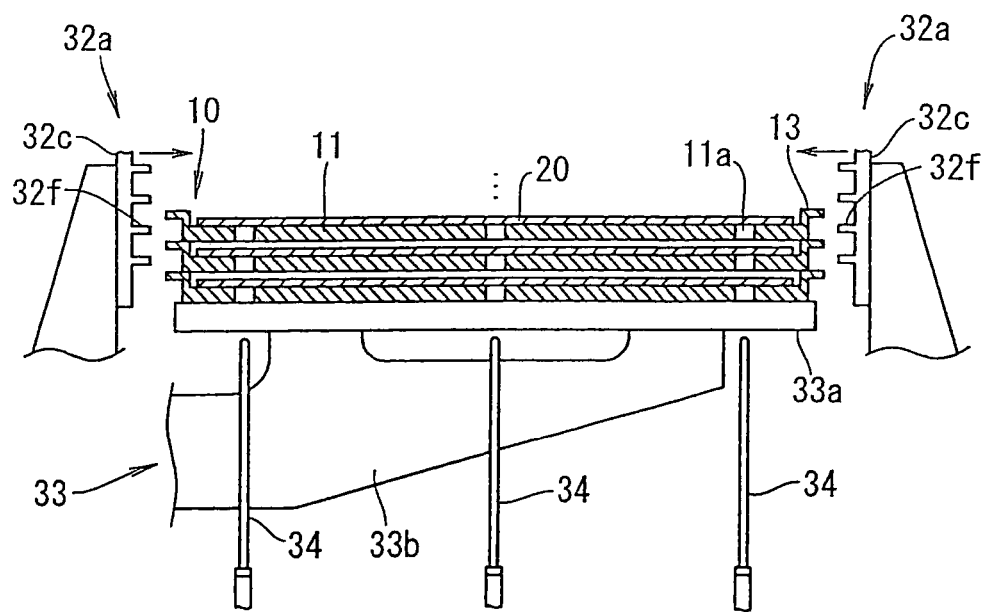

As shown in FIG. 9, the height of the elevatable table 33 is adjusted such that the substrate accommodating trays 10 are engaged with the engaging claws 32f provided on the tray side engaging members 32c, except for the lowest substrate accommodating tray 10. In other words, the lowest substrate accommodating tray 10 is not engaged with the engaging claws 32f. When the height of the elevatable table 33 is thus adjusted, the hydraulic cylinders 32e on the upper surface of the supporting base 31 are driven in synchronization with each other, such that the three tray side engaging members 32c on one support 32b and the three tray side engaging members 32c on the other support 32b move toward the substrate accommodating trays 10.

Figure 10:
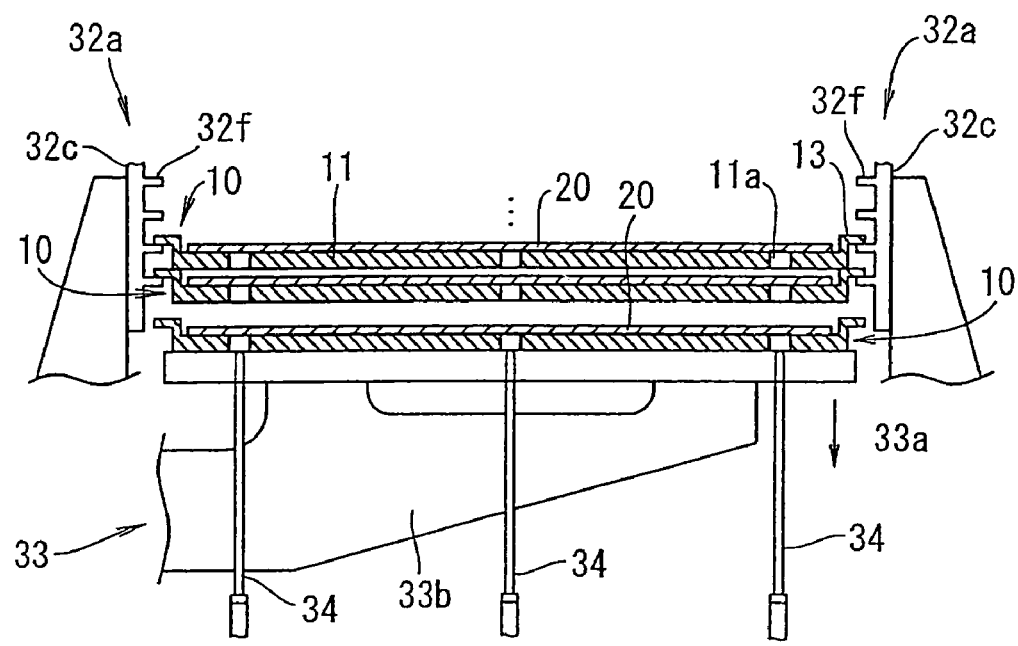

Thus, as shown in FIG. 10, the substrate accommodating trays 10 are engaged with the engaging claws 32f through the engaging sections 13, except for the lowest substrate accommodating tray 10. The substrate accommodating trays 10, except for the lowest substrate accommodating tray 10, are held by the tray holding unit 32. The lowest substrate accommodating tray 10 remains on the table section 33a without being held by the tray holding unit 32.

Then, the elevatable table 33 is moved down by the elevating unit 35. The lowest substrate accommodating tray 10 on the table section 33a is also moved down (i.e., the support pins 34 are moved up with respect to the lowest substrate accommodating tray 10). While the elevatable table 33 is moved down, the support pins 34 provided inside the supporting base 31 go through the lattice table section 33a and are inserted into the openings 11a of the bottom section 11 of the lowest substrate accommodating tray 10.

Figure 11:
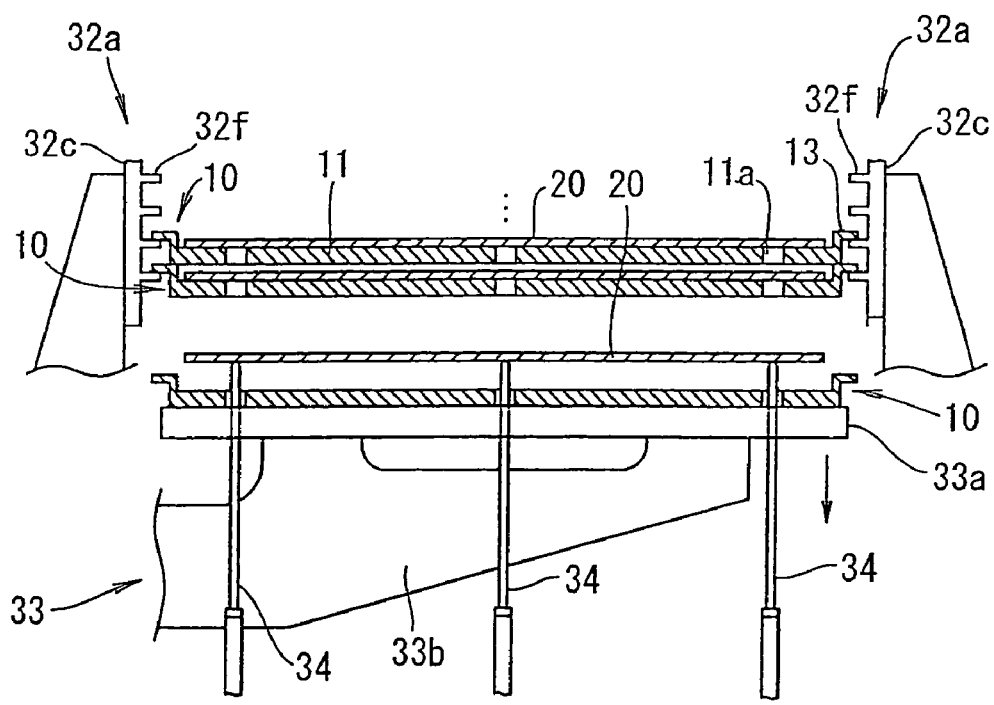

When the elevatable table 33 is moved further down, as shown in FIG. 11, the top end of each support pin 34 contacts a bottom surface of the glass substrate 20 accommodated in the lowest substrate accommodating tray 10. Then, the glass substrate 20 is raised relative to the lowest substrate accommodating tray 10 positionally relatively while being supported by the support pins 34. Namely, the top end of each support pin 34 is above the lowest substrate accommodating tray 10. (The support pins 34 are moved up relative to the substrate accommodating tray 10.) The glass substrate 20, when completely raised above the lowest substrate accommodating tray 10, is held horizontally at a prescribed height while still supported by the support pins 34.

When the glass substrate 20 is put into this state, the elevatable table 33 is stopped. Then, the glass substrate 20 is released from the support pins 34 and transferred to a prescribed position by a transfer member.

As the transfer member, for example, an adsorption hand as described in Japanese Laid-Open Publication No. 2001-93969 is used. The adsorption hand includes a pair of adsorption pads provided parallel to each other at the same height. Each adsorption pad is a flat plate-like shape and has a thickness of about 20 mm. The adsorption pad can vacuum-adsorb the bottom surface of the glass substrate 20. The adsorption hand operates as follows. Each adsorption pad is inserted into a position below the glass substrate 20, which is raised and held in a horizontal state by the support pins 34; and is slid upward. The glass substrate 20, when thus is placed on the adsorption hand, is vacuum-adsorbed to the adsorption hand. Then, the glass substrate 20 is transferred to the prescribed position.

Figure 12:
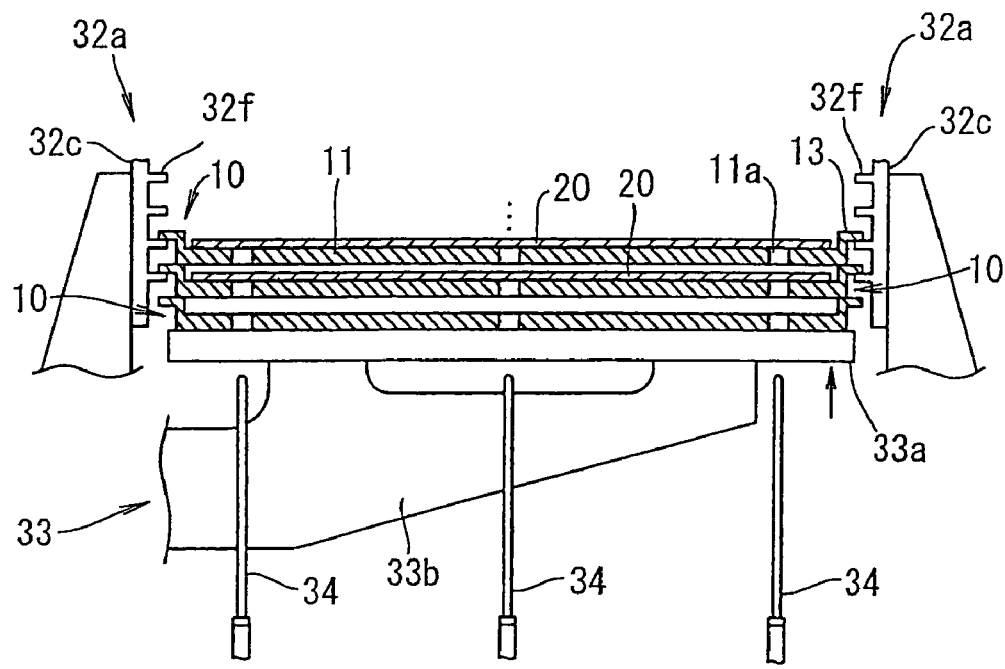

When the glass substrate 20 is removed as described above, the elevatable table 33 is moved up by the elevating unit 35. Thus, the lowest substrate accommodating tray 10, from which the glass substrate 20 has been removed, moves up together with the elevatable table 33. As shown in FIG. 12, the lowest substrate accommodating tray 10 contacts the second lowest substrate accommodating tray 10 (i.e., the lowest substrate accommodating tray 10 among the plurality of substrate accommodating trays 10 held by the tray holding unit 32). Then, the upward movement of the elevatable table 33 is stopped.

Figure 13:
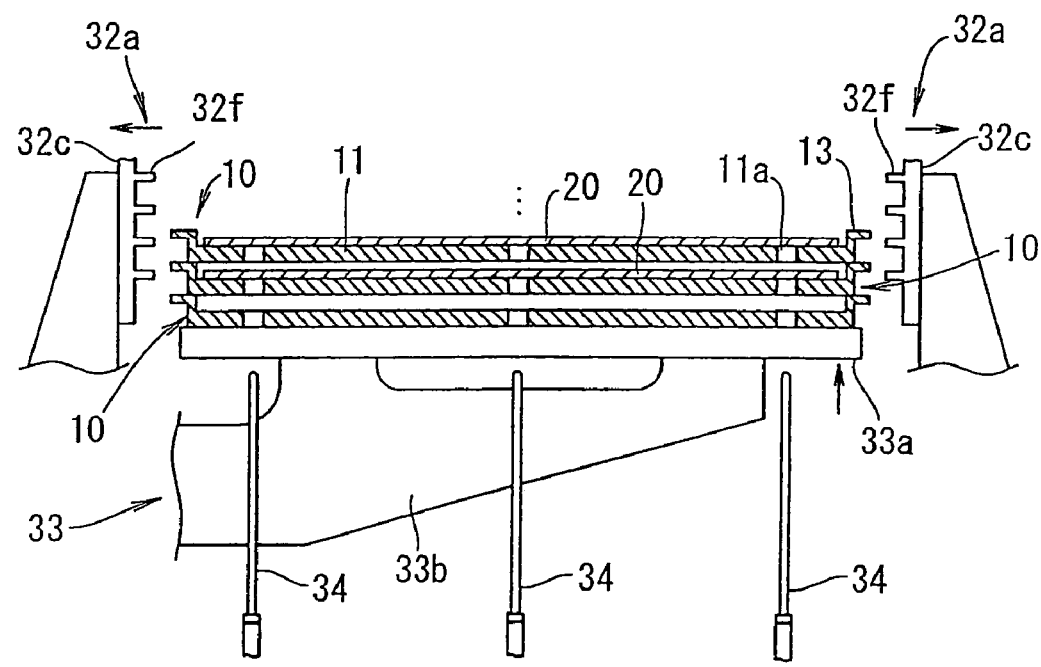

As shown in FIG. 13, the supports 32b are driven by the hydraulic cylinders 33e to move farther from the substrate accommodating trays 10. Thus, the substrate accommodating trays 10 are released from the engagement with the tray side engaging members 32c, and rests on the substrate accommodating tray 10 which is on the table section 33a of the elevatable table 33. The lowest substrate accommodating tray 10 does not accommodate a glass substrate 20.

Figure 14:
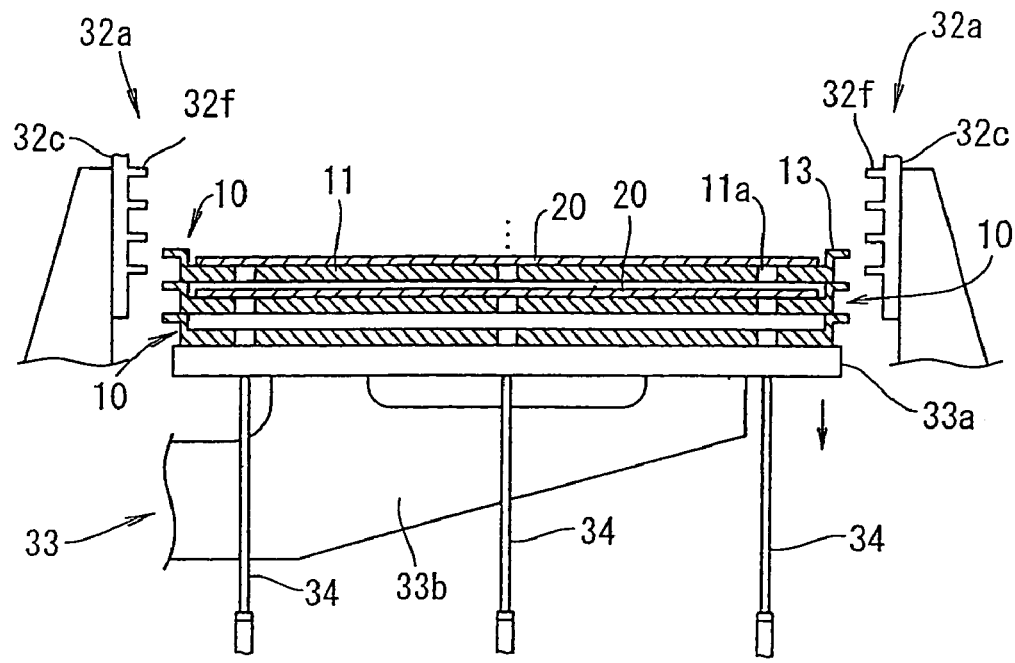

As shown in FIG. 14, the elevatable table 33 is moved down by a distance corresponding to one substrate accommodating tray 10. The height of the elevatable table 33 is adjusted such that the substrate accommodating trays 10 are engaged with the engaging claws 32f, except for the lowest substrate accommodating tray 10 with no glass substrate 20 and the second lowest substrate accommodating tray 10 (i.e., the lowest substrate accommodating tray 10 among the plurality of substrate accommodating trays 10 each accommodating a glass substrate 20). When the height of the elevatable table 33 is thus adjusted, the hydraulic cylinders 32e are driven in synchronization with each other, such that the three tray side engaging members 32c on one support 32b and the three tray side engaging members 32c on the other support 32b move toward the substrate accommodating trays 10.

Figure 15:
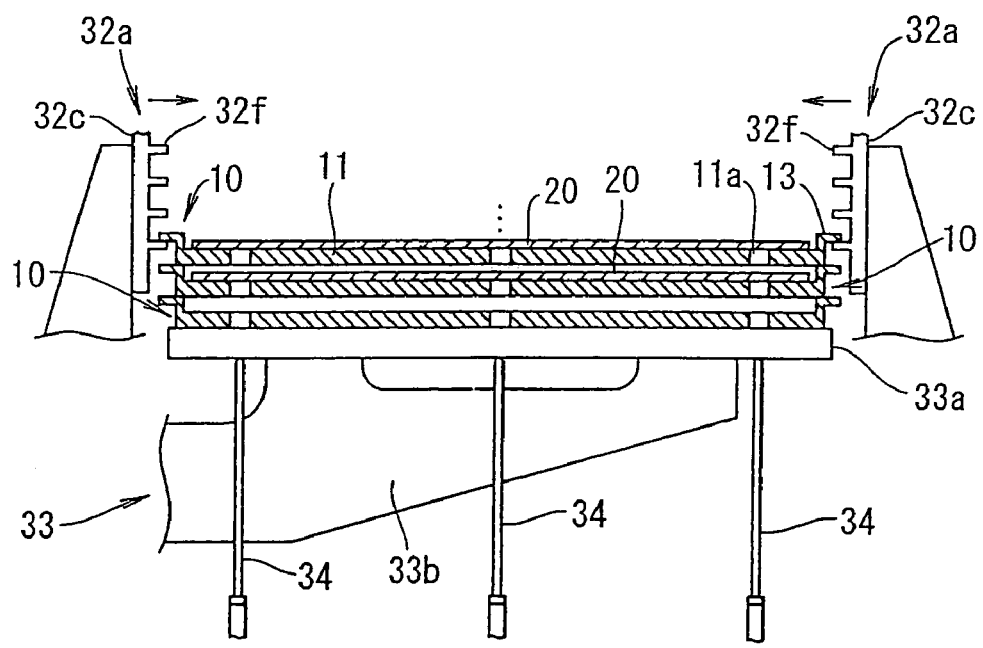

Thus, as shown in FIG. 15, the substrate accommodating trays 10 are engaged with the engaging claws 32f, except for the lowest substrate accommodating tray 10 with no glass substrate 20 and the second lowest substrate accommodating tray 10 (i.e., the lowest substrate accommodating tray 10 among the plurality of substrate accommodating trays 10 each accommodating a glass substrate 20). The substrate accommodating trays 10, except for the lowest and the second lowest substrate accommodating trays 10, are held by the tray holding unit 32. The lowest and the second lowest substrate accommodating trays 10 remain on the table section 33a without being held by the tray holding unit 32.

Then, the elevatable table 33 is moved down by the elevating unit 35. The lowest and the second lowest substrate accommodating trays 10 on the table section 33a are also moved down. While the elevatable table 33 is moved down, the support pins 34 provided inside the supporting base 31 go through the lattice table section 33a and are inserted into the openings 11a of the lowest and the second lowest substrate accommodating trays 10 sequentially.

Figure 16:
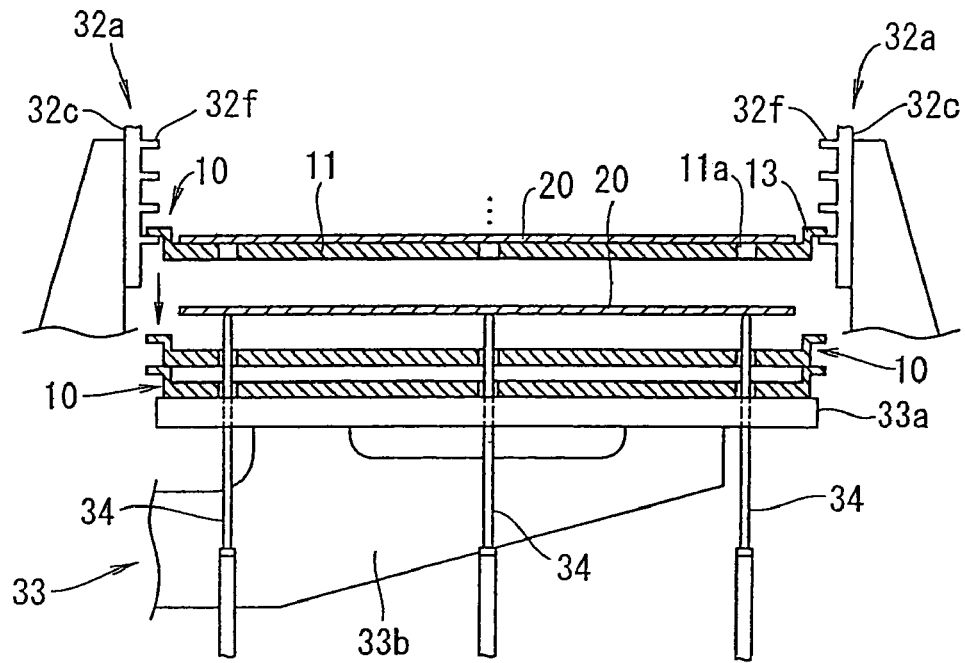

When the elevatable table 33 is moved further down, as shown in FIG. 16, the top end of each support pin 34 contacts a bottom surface of the glass substrate 20 accommodated in the second lowest substrate accommodating tray 10. Then, the glass substrate 20 is raised relative to the second lowest substrate accommodating tray 10 positionally relatively while being supported by the support pins 34. The glass substrate 20, when completely raised above the second lowest substrate accommodating tray 10, is held horizontally at a prescribed height while still supported by the support pins 34.

When the glass substrate 20 is put into this state, the elevatable table 33 is stopped. Then, the glass substrate 20 is released from the support pins 34 and transferred to a prescribed position by a transfer member such as, for example, an adsorption hand.

When the glass substrate 20 is removed as described above, the lowest and the second lowest substrate accommodating trays 10, from which the glass substrates 20 have been removed, remain on the table section 33a of the elevatable table 33.

By repeating the above-described operation, the lowest substrate accommodating tray 10 among the plurality of substrate accommodating trays 10 held by the tray holding unit 32 is placed on the substrate accommodating trays 10 sequentially on the table section 33a. By the elevatable table 33 moving down, the glass substrate 20 accommodated in the substrate accommodating tray 10 placed on the table section 33a is removed from the substrate accommodating tray 10 while supported horizontally by the support pins 34. The removed glass substrate 20 is then transferred.

Figure 17:
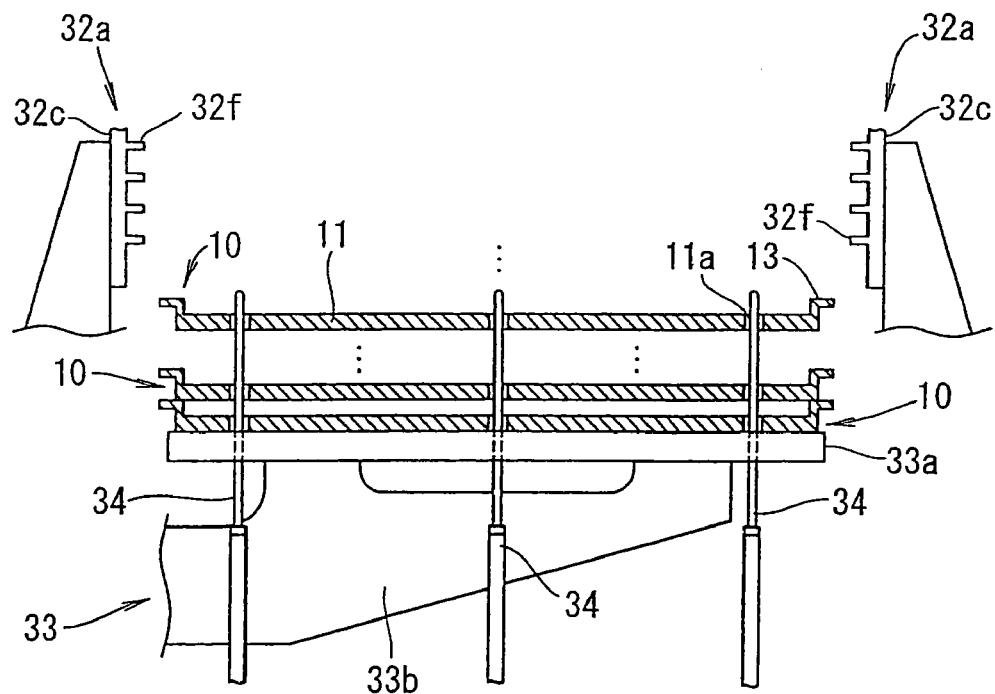

As a result, as shown in FIG. 17, the plurality of substrate accommodating trays 10 with no glass substrate 20 remain on the table section 33a. These substrate accommodating trays 10 stacked vertically are transferred from the table section 33a.

As described above, the substrate transfer apparatus 30 according to the present invention can remove, with high efficiency, the glass substrates 20 from the substrate accommodating trays 10 stacked vertically. Since the substrate accommodating trays 10 are moved up and down to remove the glass substrates 20 therefrom, the planar size of the substrate transfer apparatus 30 is relatively small and the structure of the substrate transfer apparatus 30 is relatively simple.

The substrate transfer apparatus 30 is also used for placing a glass substrate 20 in each of a plurality of substrate accommodating trays 10 stacked vertically.

With reference to FIGS. 18 through 25, an operation of the substrate transfer apparatus 30 for accommodating a substrate 20 in each of the plurality of substrate accommodating trays 10 will be described. Basically, the substrate transfer apparatus 30 operates oppositely to the above-described process.

Figure 18:
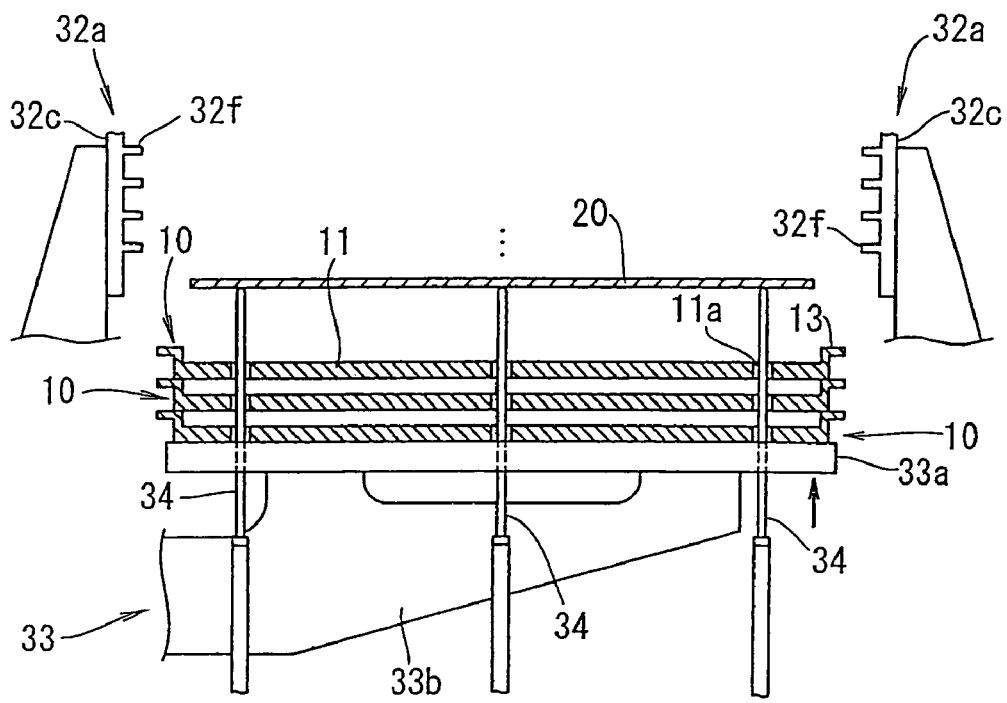
FIGS. 18 through 25 are schematic views illustrating an operation of the substrate transfer apparatus shown in FIG. 5 for placing a substrate in the substrate accommodating tray shown in FIG. 1.

As shown in FIG. 18, a plurality of substrate accommodating trays 10 stacked vertically with no glass substrate 20 are placed on the table section 33a. Then, the elevatable table 33 is moved down. Alternatively, the plurality of substrate accommodating trays 10 with no glass substrate 20 may be placed on the table section 33a after the elevatable table 33 is moved down.

In this state, the support pins 34 are inserted into the plurality of substrate accommodating trays 10, and the top end of each support pin 34 is above the highest substrate accommodating tray 10.

Figure 19:
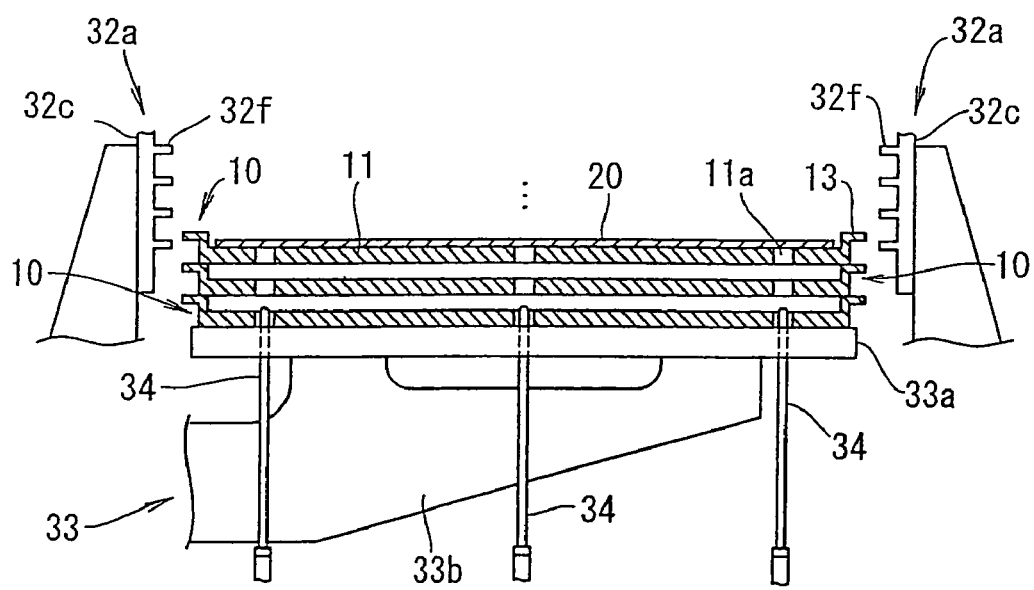

Then, still as shown in FIG. 18, a glass substrate 20 is transferred by a transfer member such as, for example, an adsorption hand, and is placed horizontally on the top ends of the support pins 34. The elevatable table 33 is moved up and, as shown in FIG. 19, the glass substrate 20 is accommodated in the highest substrate accommodating tray 10 among the plurality of substrate accommodating trays 10 on the table section 33a. The elevatable table 33 continues to be moved up to such a position that the highest substrate accommodating tray 10 accommodating the glass substrate 20 is engaged with the engaging claws 32f of the tray holding unit 32.

Figure 20:
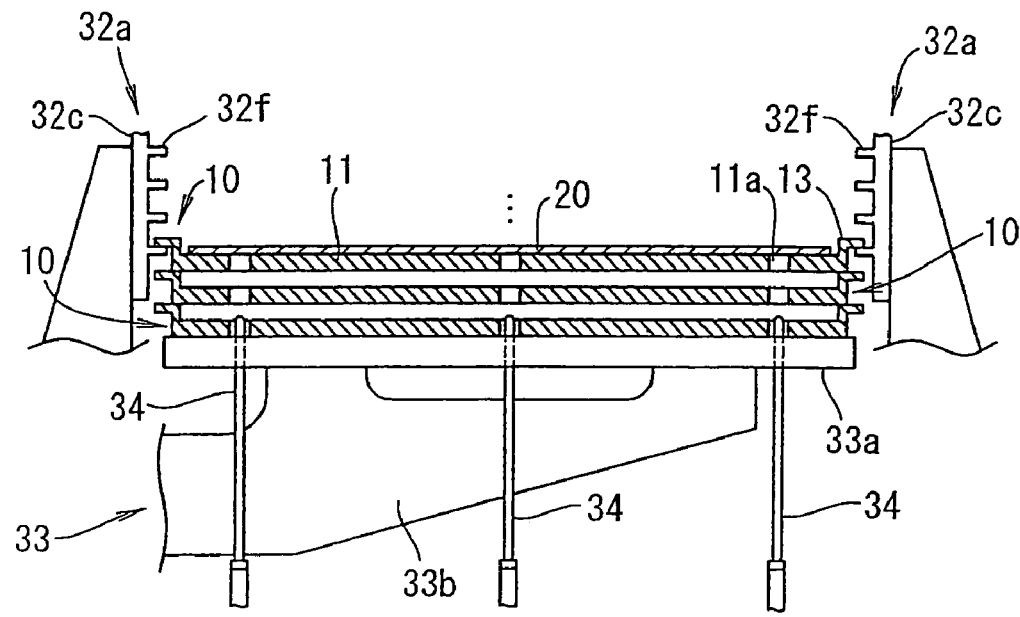

At this point, the upward movement of the elevatable table 33 is stopped. As shown in FIG. 20, the highest substrate accommodating tray 10 is engaged with the lowest engaging claws 32f. Thus, the highest substrate accommodating tray 10 is held by the tray holding unit 32.

Then, the elevatable table 33 is moved down. Thus, the plurality of substrate accommodating trays 10 on the table section 33a are also moved down, except for the highest substrate accommodating tray 10 held by the tray holding unit 32. The support pins 34 inside the supporting base 31 are inserted into the substrate accommodating trays 10 placed on the table section 33a.

Figure 21:
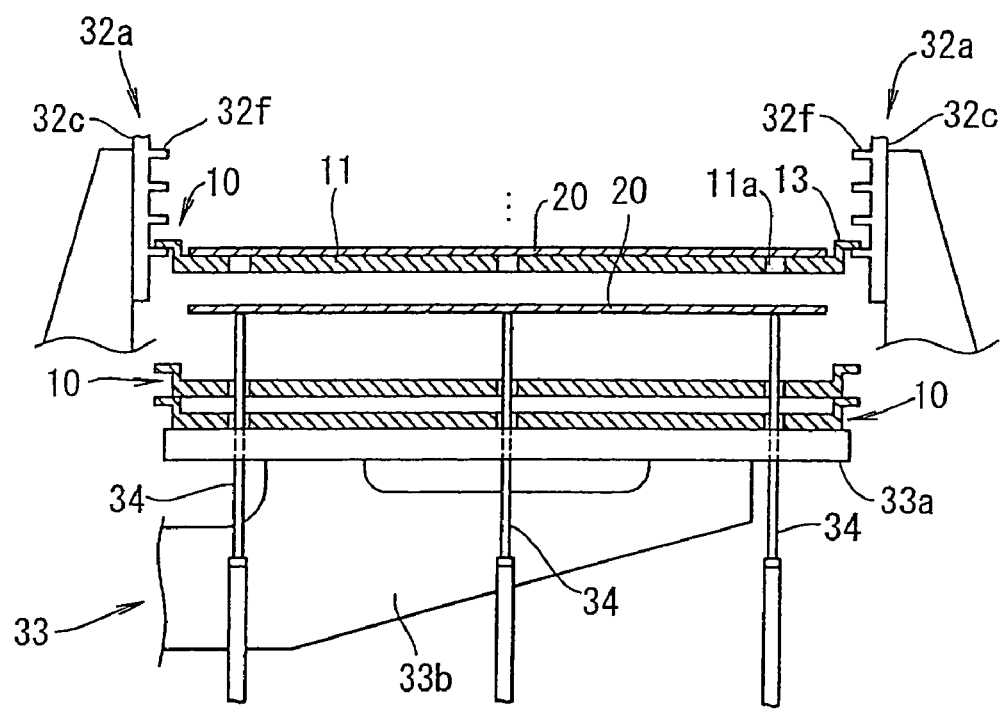
Figure 22:
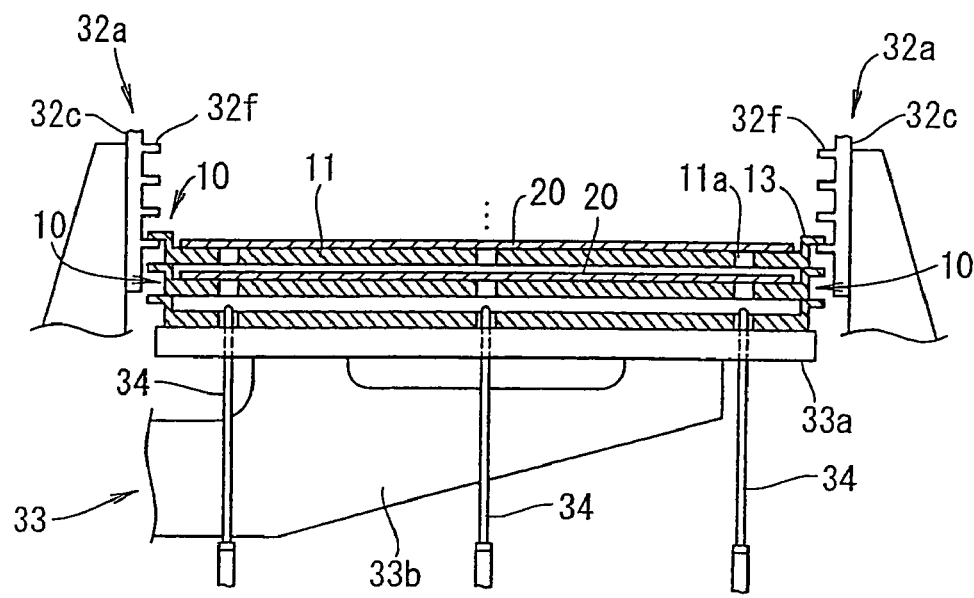

As shown in FIG. 21, a glass substrate 20 is transferred by a transfer member and placed horizontally on the top ends of the support pins 34. The elevatable table 33 is moved up and, as shown in FIG. 22, the glass substrate 20 is accommodated in the second highest substrate accommodating tray 10 (i.e., the highest substrate accommodating tray 10 among the plurality of substrate accommodating trays 10 on the table section 33a). The elevatable table 33 continues to be moved up until the second highest substrate accommodating tray 10 contacts the bottom surface of the highest accommodating tray 10 held by the tray holding unit 32. At this point, the upward movement of the elevatable table 33 is stopped.

Figure 23:
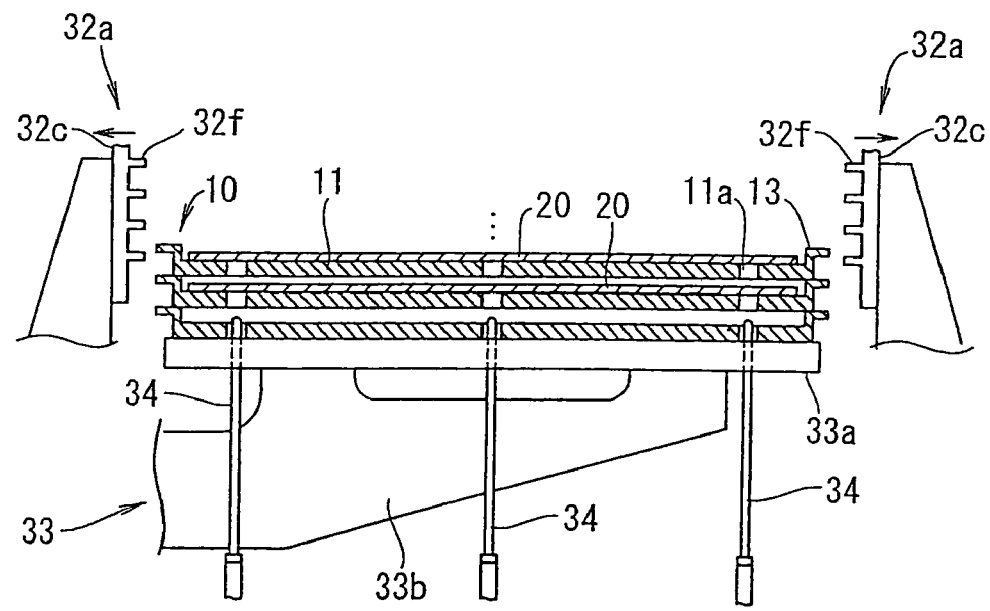
Figure 24:
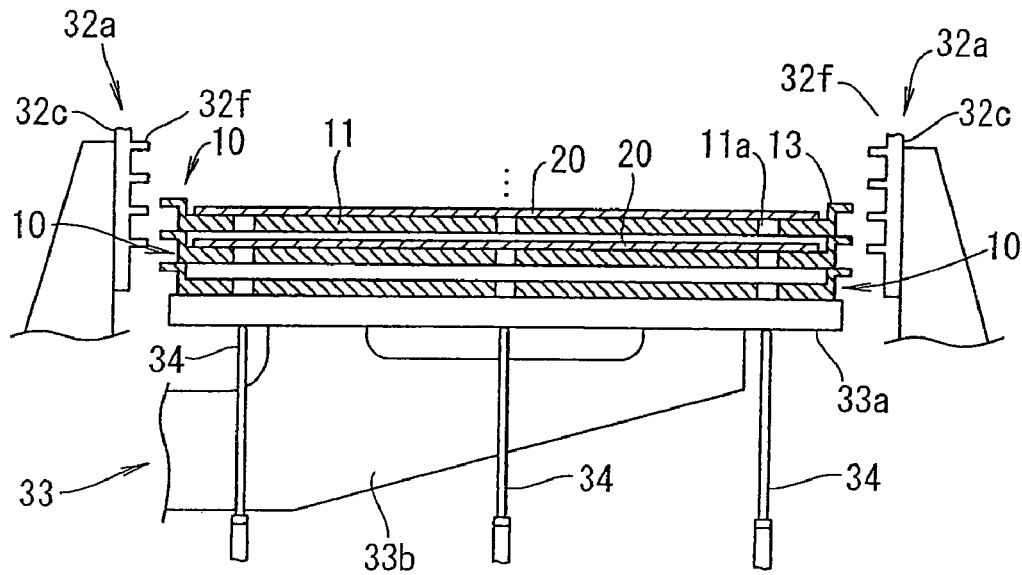

As shown in FIG. 23, the highest substrate accommodating tray 10 is released from the engagement with the tray side engaging members 32c of the tray holding unit 32, and rests on the remaining substrate accommodating trays 10 which rests on the table section 33a. As shown in FIG. 24, the elevatable table 33 is moved up by a distance corresponding to one substrate accommodating tray 10. The height of the elevatable table 33 is adjusted such that the highest and the second highest substrate accommodating trays 10 are engaged with the engaging claws 32f.

Figure 25:
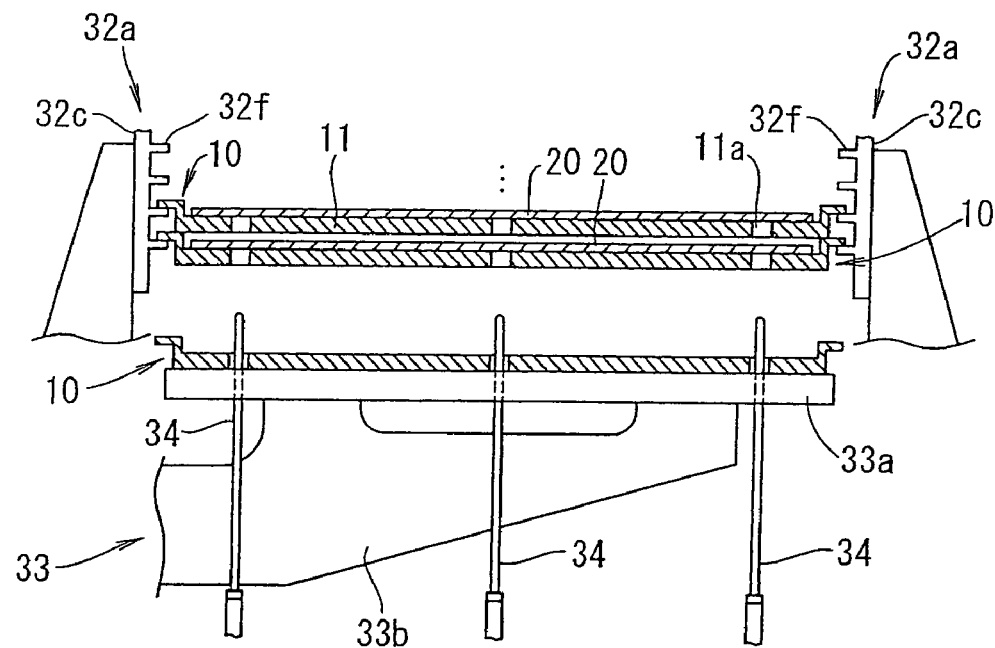

When the height of the elevatable table 33 is thus adjusted, as shown in FIG. 25, the highest and the second highest substrate accommodating trays 10 are engaged with the two lowest engaging claws 32f of the tray holding unit 32.

Then, the elevatable table 33 is moved down, and the substrate accommodating trays 10 are also moved down while being on the table section 33a, except for the highest and the second highest substrate accommodating trays 10 each accommodating a glass substrate 20. The support pins 34 are inserted into the substrate accommodating trays 10 on the table section 33a.

By repeating the above-described operation, a glass substrate 20 is placed in the highest substrate accommodating tray 10 among the plurality of substrate accommodating trays 10 placed on the table section 33a sequentially. The plurality of substrate accommodating trays 10 in the substrate transfer apparatus 30, each accommodating a glass substrate 20, are placed on the table section 33a while being stacked vertically, and then integrally transferred.

As described above, the substrate transfer apparatus 30 according to the present invention can place, with high efficiency, the glass substrates 20 in the substrate accommodating trays 10 stacked vertically. Since the substrate accommodating trays 10 are stacked vertically while accommodating the glass substrates 20, the work efficiency of accommodating the glass substrates 20 is significantly improved.

The substrate accommodating tray 10 in the above example is for accommodating a glass substrate 20 for a liquid crystal display panel. The substrate accommodating tray handled by a substrate transfer apparatus according to the present invention is not limited to such a substrate, and may be a glass substrate for other types of display panels. The substrate handled by the substrate transfer apparatus according to the present invention is not limited to a glass substrate and may be a synthetic substrate or the like.

In the above example, the elevating unit 35 for elevating the elevatable table 33 uses the ball screw mechanism. The elevating section 33f may include a belt transport mechanism including a pair of pulleys located vertically and a belt extended around the pulleys, instead of the ball screw mechanism. In this case, the elevatable table 33 is moved up and down by the belt transport mechanism.

The substrate transfer apparatus 30 does not need to include the elevatable table 33 or the elevating unit 35. Provision of a plurality of support pins 34 corresponding to the openings 11a of the substrate accommodating trays 10 below the tray holding unit 32 is sufficient. In such a structure, the glass substrate 20 may be removed from the substrate accommodating tray 10 as follows. Among the plurality of substrate accommodating trays 10 held by the tray holding unit 32, only the lowest substrate accommodating tray 10 is released from the tray holding unit 32. The lowest substrate accommodating tray 10 is moved downward by its own weight. The glass substrate 20, accommodated in the lowest substrate accommodating tray 10, which is moving down, is removed using the support pins 34. This further simplifies the structure of the substrate transfer apparatus.

In this case, the moving speed of the substrate accommodating tray 10 is reduced, such that the glass substrate 20 is removed with certainty with no risk of being damaged.

The support pins 34 do not need to have a length sufficient to be inserted into the plurality of substrate accommodating trays 10. The support pins 34 may have a length sufficient to be inserted into only one substrate accommodating tray 10. In this case, each time the glass substrate 20 is removed from one substrate accommodating tray 10, the substrate accommodating tray 10 may be transferred. This further reduces the size of the substrate transfer apparatus.

In the case where the support pins 34 have a length sufficient to be inserted into the plurality of substrate accommodating trays 10, one substrate accommodating tray 10 may be received by the substrate transfer apparatus 30 by an appropriate method without using the elevatable table 33 or the tray holding unit 32. The received substrate accommodating tray 10 is moved down such that the support pins 34 run through the openings 11a of the substrate accommodating tray 10. Thus, the glass substrate 20 accommodated in the substrate accommodating tray 10 is supported by the support pins 34 and thus removed. By repeating this operation, the substrate accommodating trays 10 are stacked vertically when a glass substrate 20 is removed from each substrate accommodating tray 10.

As described above, a substrate transfer apparatus and a method for removing a substrate according to the present invention can remove, with high efficiency, a substrate from each of a plurality of substrate accommodating trays stacked vertically. Since the substrate accommodating trays, from which the substrates have been removed, are stacked vertically, the subsequent work of transferring the substrate accommodating trays can be performed with highly efficiently. Similarly, a method for accommodating a substrate according to the present invention can place, with high efficiency, a substrate in each of a plurality of substrate accommodating trays stacked vertically.

A substrate transfer apparatus according to the present invention has a small area and is compact, and is economical.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A substrate transfer apparatus comprising:
a plurality of substrate accommodating trays stacked vertically each for accommodating a substrate in a horizontal state, a given one of the plurality of substrate accommodating trays accommodating a substrate;
a plurality of support pins for raising the substrate accommodated in the given substrate accommodating tray above the given substrate accommodating tray,
wherein:
the substrate accommodating trays includes a plurality of openings through which the plurality of support pins are to be inserted,
the plurality of support pins are moved up relative to the given substrate accommodating tray and are inserted through the plurality of openings of the given substrate accommodating tray, so as to raise the substrate, and
the plurality of support pins each have a length sufficient to be vertically inserted through the plurality of substrate accommodating trays.

2. A substrate transfer apparatus according to claim 1, further comprising an elevatable table for raising and lowering the substrate accommodating tray while having the substrate accommodating tray on the elevatable table,
wherein the plurality of support pins are inserted through the plurality of openings of the plurality of substrate accommodating trays stacked vertically on the elevatable table as the elevatable table moves down.

3. A substrate transfer apparatus according to claim 2, wherein the elevatable table is moved up and down by a ball screw mechanism.

4. A substrate transfer apparatus according to claim 2, wherein the elevatable table is moved up and down by a belt transport mechanism.

5. A substrate transfer apparatus for removing a substrate from a substrate accommodating tray accommodating the substrate in a horizontal state, the substrate transfer apparatus comprising:
a tray holding unit for holding, in a horizontal state, at least one of a plurality of substrate accommodating trays stacked vertically; and
a plurality of support pins for raising a substrate accommodated in a prescribed substrate accommodating tray which is released from the tray holding unit above the prescribed substrate accommodating tray,
wherein:
the plurality of substrate accommodating trays each include a plurality of openings through which the plurality of support pins are to be inserted, and
the plurality of support pins are moved up relative to the prescribed substrate accommodating tray and are inserted through the plurality of openings of the prescribed substrate accommodating tray, so as to raise the substrate accommodated in the prescribed substrate accommodating tray.

6. A substrate transfer apparatus according to claim 5, wherein the plurality of support pins are inserted into the plurality of openings of a plurality of substrate accommodating trays released from the tray holding unit, so as to raise the substrate accommodated in the prescribed substrate accommodating tray.

7. A substrate transfer apparatus according to claim 5, further comprising an elevatable table for raising and lowering at least one substrate accommodating tray released from the tray holding unit while having the at least one substrate accommodating tray on the elevatable table,
wherein, where a plurality of substrate accommodating trays stacked vertically are placed on the elevatable table, the plurality of support pins are inserted through the plurality of openings of the plurality of substrate accommodating trays placed on the elevatable table as the elevatable table moves down, so as to raise the substrate accommodated in the prescribed substrate accommodating tray.

8. A substrate transfer apparatus according to claim 7, wherein the elevatable table is moved up and down by a ball screw mechanism.

9. A substrate transfer apparatus according to claim 7, wherein the elevatable table is moved up and down by a belt transport mechanism.

10. A substrate transfer apparatus according to claim 5, wherein the tray holding unit holds each of the plurality of substrate accommodating trays in a horizontal state.

11. A substrate transfer apparatus according to claim 5, wherein the tray holding unit holds at least one of the plurality of substrate accommodating trays in a horizontal state, the at least one substrate accommodating tray accommodating a substrate.

12. A substrate transfer apparatus according to claim 5, wherein the tray holding unit includes an engaging claw to be engaged with the at least one substrate accommodating tray.

13. A substrate transfer apparatus according to claim 5, wherein the tray holding unit holds the at least one substrate accommodating tray by a frictional force.

14. A method for removing a substrate accommodated in each of a plurality of substrate accommodating trays stacked vertically, the method comprising the steps of:
(a) separating the lowest substrate accommodating tray, among a plurality of substrate accommodating trays each accommodating a substrate, from the second lowest substrate accommodating trays, among the plurality of substrate accommodating trays each accommodating a substrate, and lowering the lowest substrate accommodating tray; and
(b) inserting a plurality of support pins into a plurality of openings formed in the lowered substrate accommodating tray, thereby raising a substrate accommodated in the lowered substrate accommodating tray moved down by the plurality of support pins.

15. A method according to claim 14, further comprising the step of (c) transferring the substrate raised by the plurality of support pins,
wherein the steps (a) through (c) are repeated.

16. A method for removing a substrate accommodated in each of a plurality of substrate accommodating trays stacked vertically, the method comprising the steps of:
(a) placing the plurality of substrate accommodating trays each accommodating a substrate on an elevatable table;
(b) holding, by a tray holding unit, at least one of a plurality of substrate accommodating trays each accommodating a substrate other than the lowest substrate accommodating tray among the plurality of substrate accommodating trays each accommodating a substrate;
(c) lowering the elevatable table and inserting a plurality of support pins into a plurality of openings formed in the substrate accommodating tray placed on the elevatable table, thereby raising a substrate accommodated in the substrate accommodating tray placed on the elevatable table by the plurality of support pins; and
(d) transferring the substrate raised by the plurality of support pins.

17. A method according to claim 16, further comprising the steps of:
(e) after step (d), raising the elevatable table and contacting the substrate accommodating tray placed on the elevatable table with the lowest substrate accommodating tray among the at least one substrate accommodating tray held by the tray holding unit;
(f) releasing the at least one substrate accommodating tray from the tray holding unit and placing the released substrate accommodating tray on the elevatable table; and
(g) after step (f), performing steps (b) through (d) once more.

18. A method according to claim 17, wherein steps (e) through (g) are repeated.

19. A method for accommodating a substrate in each of a plurality of substrate accommodating trays stacked vertically, the method comprising the steps of:
(a) placing at least one substrate accommodating tray accommodating no substrate on an elevatable table and inserting a plurality of support pins into a plurality of openings formed in the at least one substrate accommodating tray;
(b) placing a substrate on the plurality of support pins in a horizontal state;
(c) raising the elevatable table and accommodating the substrate supported by the support pins in the highest substrate accommodating tray among the at least one substrate accommodating tray; and
(d) holding the substrate accommodating tray, accommodating the substrate, by a tray holding unit.

20. A method according to claim 19, further comprising the step of:
(e) after step (d), lowering the elevatable table and inserting the plurality of support pins into a plurality of openings formed in at least one substrate accommodating tray accommodating no substrate, wherein steps (b) through (e) are repeated.

* * * * *

UNITED STATES PATENT AND TRADEMARK OFFICE
CERTIFICATE OF CORRECTION

PATENT NO.          : 7,014,415 B2  
APPLICATION NO. : 10/722437  
DATED                   : March 21, 2006  
INVENTOR(S)         : Takenori Yoshizawa et al.

It is certified that error appears in the above-identified patent and that said Letters Patent is hereby corrected as shown below:

TITLE page ITEM (75), Inventor --Shigenobu Umino, Osaka (JP)-- should be added.

Signed and Sealed this

Twelfth Day of December, 2006

JON W. DUDAS  
*Director of the United States Patent and Trademark Office*